United States Patent
Kong et al.

(10) Patent No.: US 11,651,979 B2
(45) Date of Patent: May 16, 2023

(54) TRANSFER UNIT AND APPARATUS FOR TREATING SUBSTRATE

(71) Applicant: SEMES CO., LTD., Chungcheongnam-do (KR)

(72) Inventors: Tae Kyung Kong, Chungcheongnam-do (KR); Jin Sung Sun, Chungcheongnam-do (KR); Kiwon Han, Gyeonggi-do (KR)

(73) Assignee: SEMES CO., LTD., Cheonan-si (KR)

( * ) Notice: Subject to any disclaimer, the term of this patent is extended or adjusted under 35 U.S.C. 154(b) by 161 days.

(21) Appl. No.: 16/935,602

(22) Filed: Jul. 22, 2020

(65) Prior Publication Data
US 2021/0028030 A1    Jan. 28, 2021

(30) Foreign Application Priority Data
Jul. 22, 2019    (KR) .................. 10-2019-0088354

(51) Int. Cl.
| | | |
|---|---|---|
| *H01L 21/67* | (2006.01) | |
| *B65G 47/90* | (2006.01) | |
| *G03F 7/16* | (2006.01) | |
| *H01L 21/687* | (2006.01) | |

(52) U.S. Cl.
CPC ........ *H01L 21/67196* (2013.01); *B65G 47/90* (2013.01); *G03F 7/161* (2013.01); *H01L 21/67017* (2013.01); *H01L 21/68707* (2013.01)

(58) Field of Classification Search
None
See application file for complete search history.

(56) References Cited

U.S. PATENT DOCUMENTS

| | | | | |
|---|---|---|---|---|
| 7,736,118 B2 * | 6/2010 | Uratani | ............. | H01L 21/67742 414/744.6 |
| 9,943,969 B2 * | 4/2018 | Barker | ............. | H01L 21/67766 |

FOREIGN PATENT DOCUMENTS

| | | |
|---|---|---|
| JP | H04-262555 A | 9/1992 |
| JP | 2007-242702 A | 9/2007 |
| JP | 2008-264923 A | 11/2008 |

(Continued)

OTHER PUBLICATIONS

Japanese Patent Office; Office Action Issued in Correspnding Japanese Patent Application No.: 2020-123821; dated Aug. 2, 2022; 3 Pages.

*Primary Examiner* — Ronald P Jarrett
(74) *Attorney, Agent, or Firm* — Procopio, Cory, Hargreaves & Savitch LLP

(57) ABSTRACT

An apparatus for transferring a substrate is provided. A unit for transferring a substrate, includes a support structure, a first hand to place the substrate, a second hand stacked with the first hand and placing the substrate, a first guide rail guiding movement of a first support rod to support the first hand in the support structure, a second guide rail guiding movement of a second support rod in the support structure to support the second hand, and a pressure reducing member reducing pressure of an exhaust fluid passage provided in the support structure. The exhaust fluid passage includes a first fluid passage communicating with the first guide rail, a second fluid passage communicating with the second guide rail, and a third fluid passage formed by combining the first fluid passage with the second fluid passage. The pressure reducing member reduces pressure of the third fluid passage.

20 Claims, 9 Drawing Sheets

(56) References Cited

FOREIGN PATENT DOCUMENTS

| | | |
|---|---|---|
| JP | 2018-064024 A | 4/2018 |
| KR | 10-2006-0021578 A | 3/2006 |
| KR | 10-2006-0122287 A | 11/2006 |
| KR | 10-2010-0033115 A | 3/2010 |
| KR | 10-2011-0061497 A | 6/2011 |
| KR | 10-2014-0117000 A | 10/2014 |
| KR | 10-2015-0014137 A | 2/2015 |

* cited by examiner

TRANSFER UNIT AND APPARATUS FOR TREATING SUBSTRATE

CROSS-REFERENCE TO RELATED APPLICATIONS

A claim for priority under 35 U.S.C. § 119 is made to Korean Patent Application No. 10-2019-0088354 filed on Jul. 22, 2019, in the Korean Intellectual Property Office, the entire contents of which are hereby incorporated by reference.

BACKGROUND

Embodiments of the inventive concept disclosed herein relate to an apparatus for treating a substrate, and more particularly, relate to an apparatus for transferring a substrate.

To manufacture a semiconductor device, a desired pattern is formed on a substrate through various processes such as, photolithography, etching, ashing, ion implantation, and thin film deposition. The above processes include a plurality of processes, and are performed through mutually different processing devices.

Accordingly, to perform mutually different processes, a substrate has to be transferred to the mutually different processing devices, and the transferring of the substrate is performed by the transfer robot. There are significantly various process devices, and the process devices are arranged to surround the peripheral portion of the transfer robot. Accordingly, the transfer robot may transfer each device to the substrate. In general, a transfer robot has a plurality of hands to support a substrate and may transfer a plurality of sheets of substrates.

FIG. 1 is a view illustrating a typical transfer robot. Referring to FIG. 1, the transfer robot has two hands. The hands are provided to be stacked on each other and supported by a support rod. A first hand 2a positioned at an upper portion of the transfer robot is supported by a first support rod 4a, and a second hand 2b positioned at a lower portion of the transfer robot is supported by a second support rod 4b. The first support rod 4a extends from one side portion of the first hand 2a and is connected to a base. The second support rod 4b extends from an opposite side of the second hand 2b and is connected to the base. Accordingly, the first support rod 4a and the second support rod 4b are linearly movable without interference with each other on a moving path.

However, the structure to support a hand using a single rod may not stably support the hand. Accordingly, the hand is vibrated during movement, and the substrate placed on the hand is changed in position thereof due to the shaking. Accordingly, the substrate may deviate from a right position or may be scratched to be damaged.

In addition, various particles are produced in the process in which the support rod is moved. The particles may contaminate the substrate.

SUMMARY

Embodiments of the inventive concept provide an apparatus capable of stably supporting a hand.

Embodiments of the inventive concept provide an apparatus capable of minimizing particles produced in the procedure of operating a hand.

According to an exemplary embodiment, there is provided is a unit for transferring a substrate.

The unit for transferring the substrate includes a support structure, a first hand to place the substrate, a second hand positioned to be stacked with the first hand and to place the substrate, a first guide rail provided in the support structure to guide movement of a first support rod to support the first hand, a second guide rail provided in the support structure to guide movement of a second support rod to support the second hand, and a pressure reducing member to reduce pressure of an exhaust fluid passage provided in the support structure. The exhaust fluid passage includes a first fluid passage provided to communicate with the first guide rail, a second fluid passage provided to communicate with the second guide rail, and a third fluid passage formed by combining the first fluid passage with the second fluid passage. The pressure reducing member reduces pressure of the third fluid passage.

The first fluid passage and the second fluid passage have parts which are bent. The first guide rail may be formed on a side surface of the support structure, and the second guide rail may be formed on a top surface of the support structure. The support structure may include a main body including the exhaust fluid passage, the first guide rail, and the second guide rail, a first partition positioned in the first fluid passage to interfere with an air flow such that an air flow line of the first fluid passage is bypassed, and a second partition positioned in the second fluid passage to interfere with an air flow such that an air flow line of the second fluid passage is bypassed. The third fluid passage may be positioned more closely to a central axis of the main body than the first fluid passage and the second fluid passage.

The first partition may be positioned inward from the first guide rail to face the first guide rail. The first partition may be provided to extend downward from a ceiling surface forming the first fluid passage and is spaced apart from a bottom surface forming the first fluid passage.

The second partition may be positioned under the second guide rail while facing the second guide rail.

The third fluid passage may be formed by combining the first fluid passage and the second fluid passage, and may have a first region extending toward the central axis and a second region extending downward from the first region, and the first region may be positioned higher than a lower end of the first partition.

A unit for transferring a substrate may include a support structure, a first hand to place the substrate, a second hand positioned to be stacked with the first hand and to place the substrate, a first guide rail provided in the support structure to guide movement of a first support rod to support the first hand, a second guide rail provided in the support structure to guide movement of a second support rod to support the second hand. The first guide rail may be formed on a side surface of the support structure, and the second guide rail may be formed on a top surface of the support structure.

A plurality of first guide rails and a plurality of second guide rails may be provided, the plurality of first guide rails may be provided on opposite side surfaces of the support structure, the plurality of second guide rails may be formed on a top surface of the support, the first support rod may be connected to the plurality of first guide rails, and the second support rod may be connected to the plurality of second guide rails.

The first hand may be positioned on the second hand. The unit includes a pressure reducing member to reduce pressure of an exhaust fluid passage provided in the support structure, and the exhaust fluid passage includes a first fluid passage provided to communicate with the first guide rail, a second fluid passage provided to communicate with the second guide rail, and a third fluid passage formed by combining the first fluid passage with the second fluid passage. The pressure reducing member reduces pressure of the third fluid passage.

An apparatus for treating a substrate includes a first unit, a second unit, and a transfer unit to transfer the substrate between the first unit and the second unit. The transfer unit includes a support structure, a first hand to place the substrate, a second hand positioned to be stacked with the first hand and to place the substrate, a first guide rail provided in the support structure to guide movement of a first support rod to support a first hand, a second guide rail provided in the support structure to guide movement of a second support rod to support a second hand, and a pressure reducing member provided in the support structure to reduce pressure of the exhaust fluid passage. The exhaust fluid passage includes a first fluid passage provided to communicate with the first guide rail, a second fluid passage provided to communicate with the second guide rail, and a third fluid passage formed by combining the first fluid passage with the second fluid passage. The pressure reducing member reduces pressure of the third fluid passage.

Each of the first fluid passage and the second fluid passage may be provided bent in a direction of approaching the third fluid passage.

The first guide rail may be formed on a side surface of the support structure, and the second guide rail may be formed on a top surface of the support structure.

The support structure may include a main body including the exhaust fluid passage, the first guide rail, and the second guide rail, a first partition positioned in the first fluid passage to interfere with an air flow such that an air flow line of the first fluid passage is bypassed, and a second partition positioned in the second fluid passage to interfere with an air flow such that an air flow line of the second fluid passage is bypassed. The third fluid passage may be positioned more closely to a central axis of the main body than the first fluid passage and the second fluid passage.

The first partition may be positioned inward from the first guide rail to face the first guide rail. The first partition may be provided to extend downward from a ceiling surface forming the first fluid passage and is spaced apart from a bottom surface forming the first fluid passage. The second partition may be positioned under the second guide rail while facing the second guide rail.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
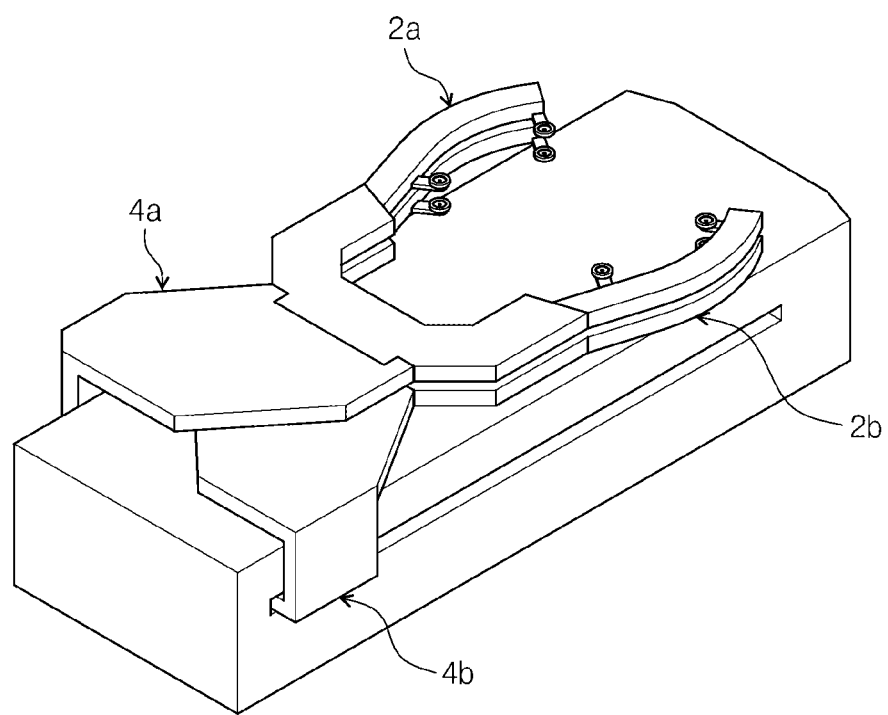
FIG. 1 is a view illustrating an exemplary transfer robot.

Hereinafter, an embodiment of the inventive concept will be described in more detail with reference to the accompanying drawings. The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

Figure 2:
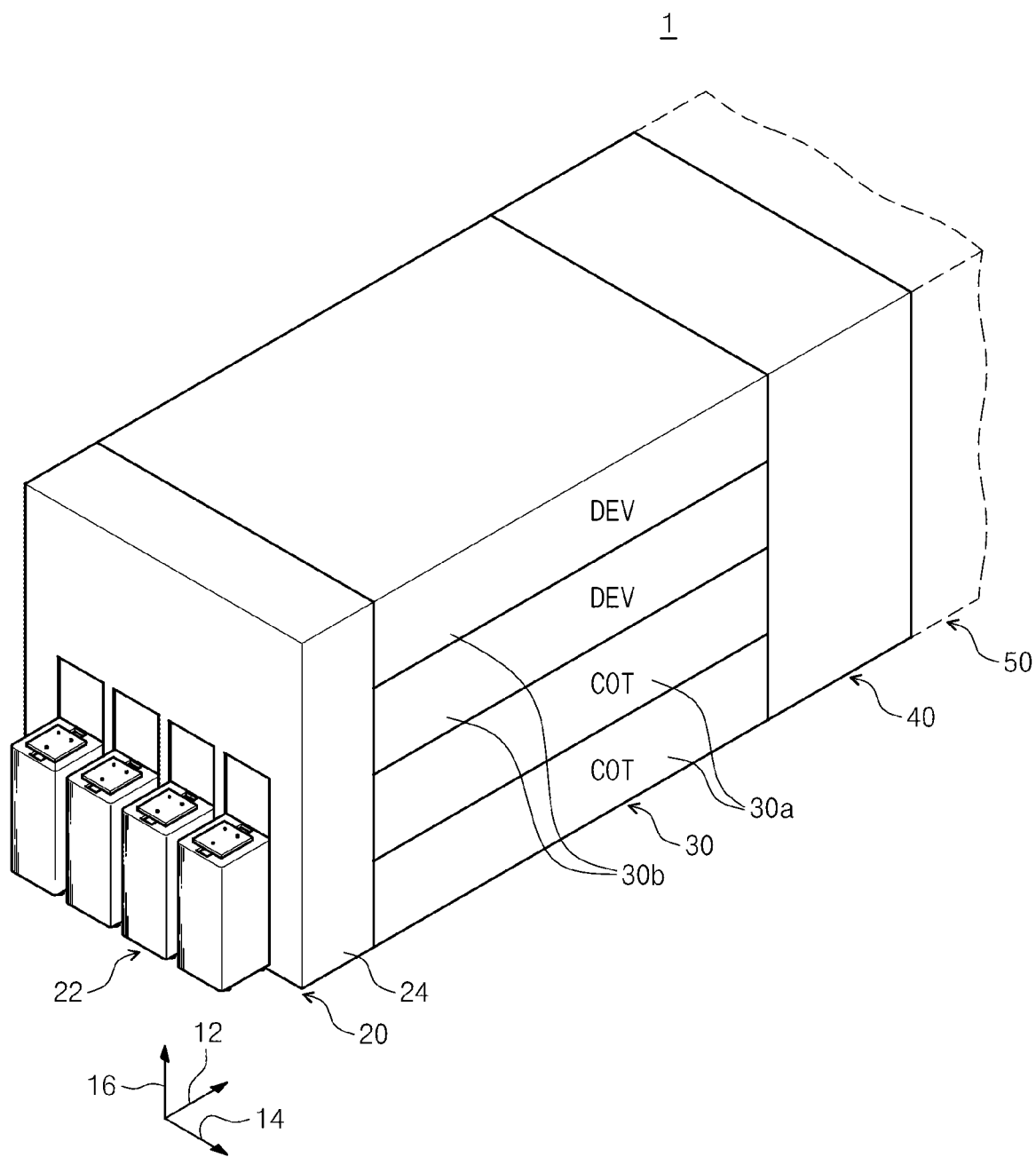
FIG. 2 is a view schematically illustrating an apparatus for treating a substrate, according to an embodiment of the inventive concept.
Figure 3:
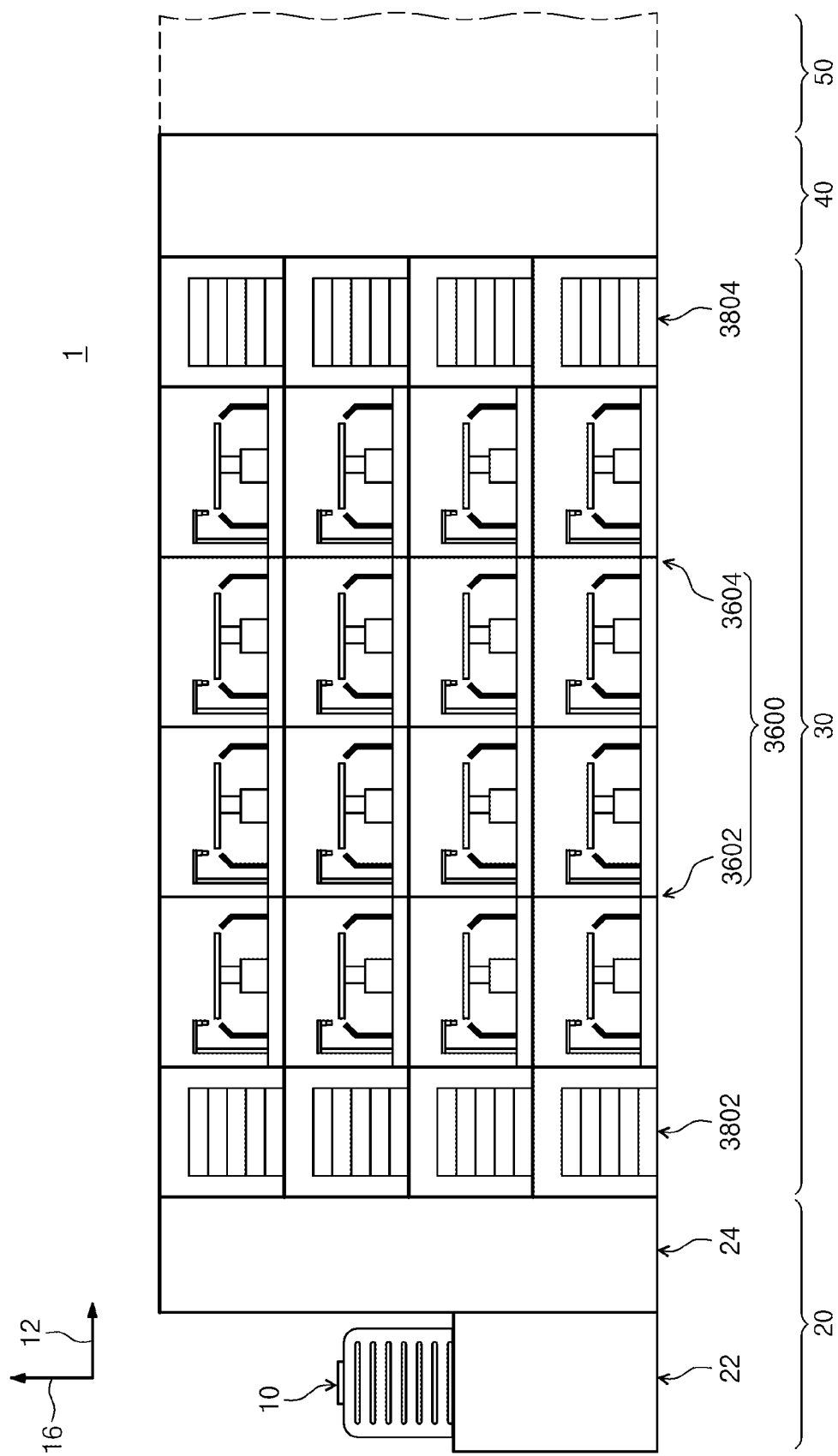
FIG. 3 is a sectional view of an apparatus for treating a substrate, which illustrates a coating block or a developing block of FIG. 2.
Figure 4:
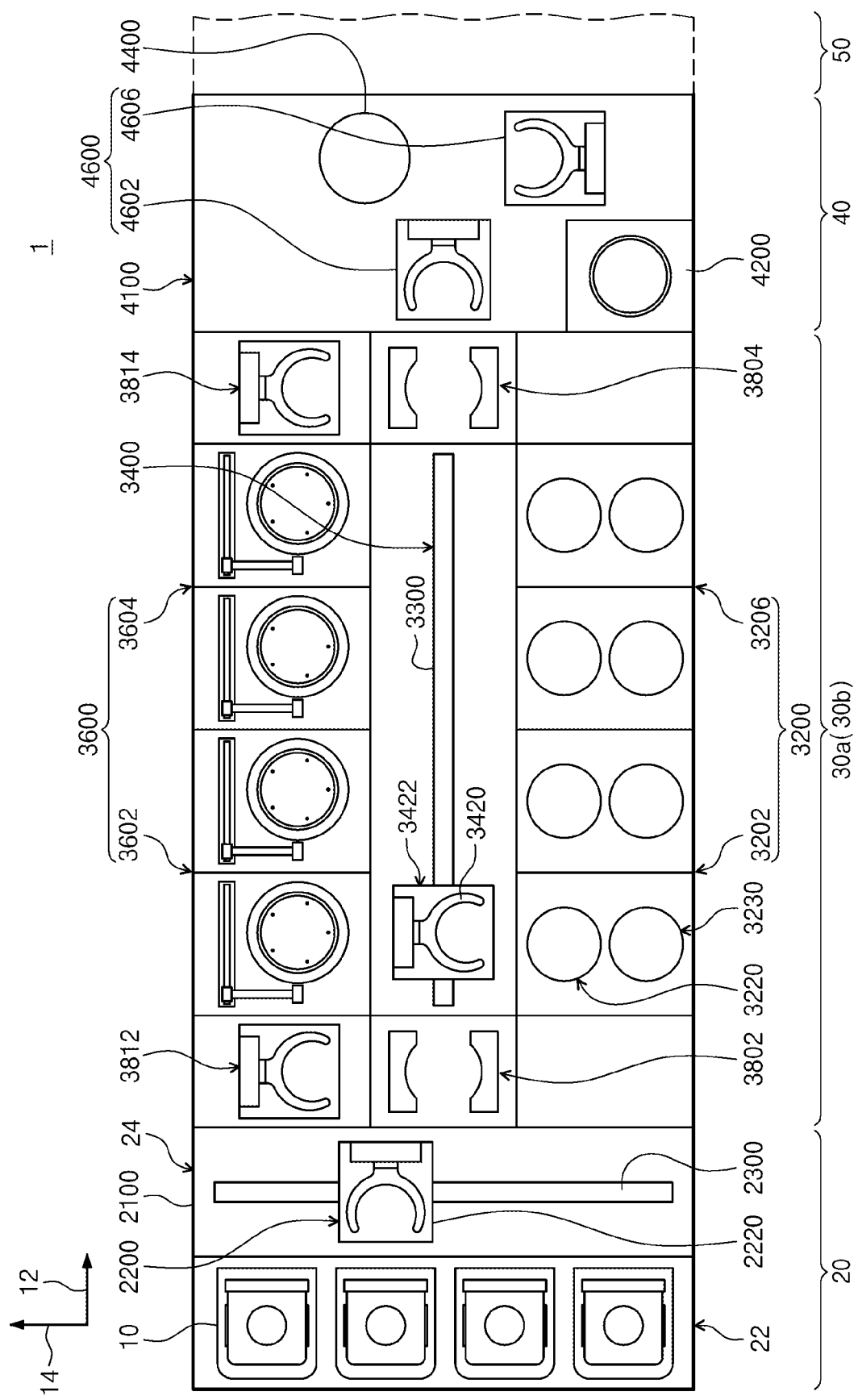
FIG. 4 is a plan view illustrating the apparatus for treating the substrate of FIG. 2.

FIG. 2 is a perspective view schematically illustrating an apparatus (substrate treating apparatus) for treating a substrate according to an embodiment of the inventive concept, FIG. 3 is a sectional view of a substrate treating apparatus, which illustrates a coating block or a developing block of FIG. 2, and FIG. 4 is a plan view of a substrate treating apparatus of FIG. 2.

Referring to FIGS. 2 to 4, a substrate treating apparatus 1 for treating a substrate includes an index module 20, a treating module 30, and an interface module 40. According to an embodiment, the index module 20, the treating module 30, and the interface module 40 are sequentially aligned in line with each other. Hereinafter, a direction in which the index module 20, the treating module 30, and the interface module 40 are arranged will be referred to as a first direction 12, a direction that is perpendicular to the first direction 12 when viewed from above will be referred to as a second direction 14, and a direction perpendicular to all the first direction 12 and the second direction 14 will be referred to as a third direction 16.

The index module 20 transfers a substrate 'W' to the treating module 30 from a container 10 to receive the substrate 'W', and a substrate 'W' completely treated is received into the container 10. The longitudinal direction of the index module 20 is provided in the second direction 14. The index module 20 has a load port 22 and an index frame 24. The load port 22 is positioned at an opposite side of the treating module 30, based on the index frame 24. The container 10 having substrates 'W' is placed in the load port 22. A plurality of load ports 22 may be provided and may be arranged in the second direction 14.

The container 10 may include a container 10 for sealing such as a front open unified pod (FOUP). The container 10 may be placed on the load port 22 by a transfer unit (not illustrated) such as Overhead Transfer, Overhead Conveyor, or Automatic Guided Vehicle.

An index robot 2200 is provided inside the index frame 24. A guide rail 2300, which has a longitudinal direction provided in the second direction 14, is provided in the index frame 24, and the index robot 2200 may be provided to be movable on the guide rail 2300. The index robot 2200 may include a hand 2220 in which the substrate 'W' is positioned, and the hand 2220 may be provided to be movable forward and backward, rotatable about the third direction 16, and movable in the third direction 16.

The treating module 30 performs coating and developing processes with respect to the substrate 'W'. The treating module 30 has a coating block 30*a* and a developing block 30*b*. The coating block 30*a* forms a coating process with respect to the substrate 'W', and the developing block 30*b* performs a developing process with respect to the substrate 'W'. A plurality of coating blocks 30*a* are provided and stacked on each other. A plurality of developing blocks 30*b* are provided, and stacked on each other. According to an embodiment of FIG. 3, two coating blocks 30*a* are provided and two developing blocks 30*b* are provided. The coating blocks 30*a* may be disposed under the developing blocks 30*b*. According to an example, two coating blocks 30*a* may be subject to the same process and may be provided in the same structure. In addition, two developing blocks 30*a* may be subject to the same process and may be provided in the same structure.

The coating block 30*a* has a heat treating chamber 3200, a transfer chamber 3400, a liquid treating chamber 3600, and a buffer chamber 3800. The heat treating chamber 3200 performs a heat treating process on the substrate 'W'. The heat treating process may include a cooling process and a heating process. The liquid treating chamber 3600 feeds a liquid onto the substrate 'W' to form a liquid film. The liquid film may be a photoresist film or an anti-reflective film. The transfer chamber 3400 transfers the substrate 'W' between the heat treating chamber 3200 and the liquid treating chamber 3600 inside the coating block 30*a*.

The transfer chamber 3400 has a longitudinal direction parallel to the first direction 12. A transfer unit is provided in the transfer chamber 3400. The transfer unit includes a transfer robot 3422 and a transfer rail 3300. The transfer robot 3422 transfers the substrate 'W' among the heat treating chamber 3200, the liquid treating chamber 3600, and the buffer chamber 3800.

Figure 5:
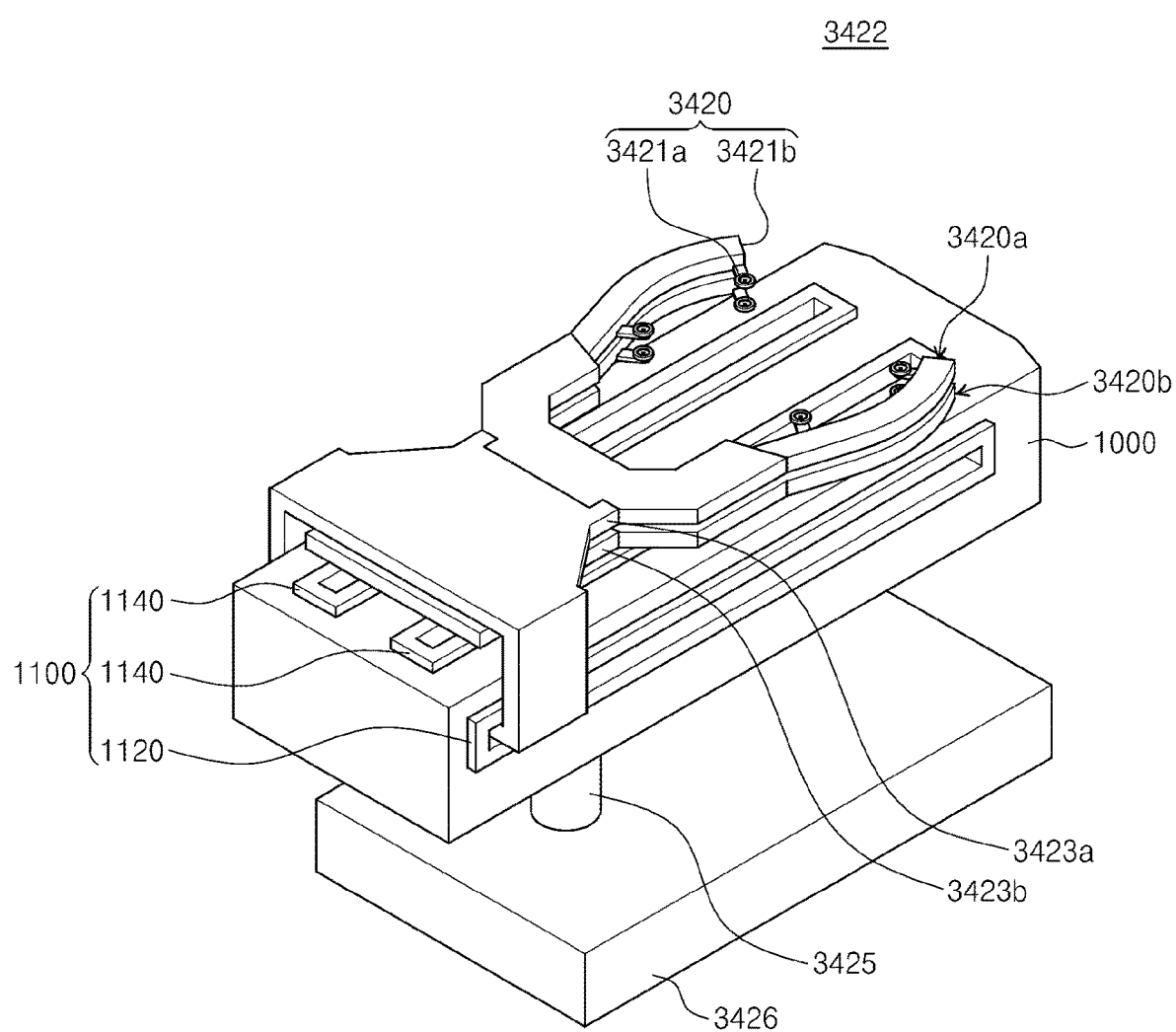
FIG. 5 is a perspective view illustrating a transfer robot of FIG. 4.
Figure 6:
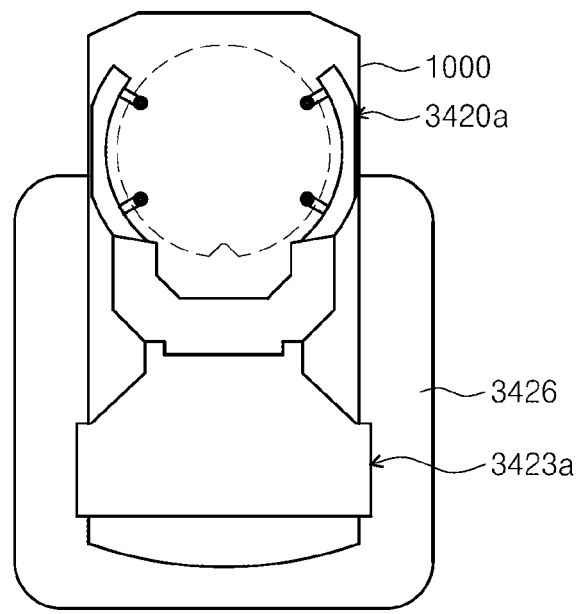
FIG. 6 is a plan view illustrating a transfer robot of FIG. 5.

FIG. 5 is a perspective view illustrating a transfer robot of FIG. 4, and FIG. 6 is a plan view illustrating the transfer robot of FIG. 5. Referring to FIGS. 5 and 6, the transfer robot 3422 includes a hand 3420, a support rod 3423, a guide rail 1100, a support structure 1000, a rotating shaft 3425, a base 3426, and a pressure reducing member 1600. The hand 3420 supports the substrate 'W'. The hand 3420 is provided to perform a horizontal-direction linear movement including a forward-movement and a backward-movement, a rotation movement for rotation about the third direction 16 serving as an axis, and an upward-movement and a downward-movement in third direction 16.

The hand 3420 directly supports the substrate 'W'. A plurality of hands 3420 are provided, and are stacked on each other. The hands 3420 are positioned on the support structure 1000. For example, the hand 3420 may include a first hand 3420*a* positioned at an upper portion and a second hand 3420*b* positioned at a lower portion. The first hand 3420*a* and the second hand 3420*b* have the same shape. However, the first hand 3420*a* and the second hand 3420*b* may perform different functions. For example, the first hand 3420*a* may be used to withdraw the substrate 'W' from a unit, which treats a chamber or the substrate 'W', and the second hand 3420*b* may be used to introduce the substrate 'W' into the unit which treats the chamber or the substrate 'W'.

The hand 3420 has a support 3421*a* and a support protrusion 3421*b*. The support 3421*a* is provided to have the shape of an annular ring in which a part of the circumference is bent. The support 3421*a* has a diameter larger than that of the substrate 'W', and the hand 3420 supports the substrate 'W' such that the support 3421*a* surrounds the peripheral portion of the substrate 'W'. The support protrusion 3421*b* extends inward from the support 3421*a*. A plurality of support protrusion 3421*b* are provided, and are spaced apart from each other in a circumferential direction of the support 3421*a*. The support protrusion 3421*b* serves as a seating surface for placing the substrate 'W'. Four supporting protrusions 3421*b* are provide to support a side portion of the substrate 'W'.

A support rod 3423 connects the support 3421*a* with the guide rail 1100. The support rod 3423 is linearly movable in a front-to-back direction through the guide rail 1100. The support rod 3423 has a first support rod 3423*a* to support the first hand 3420*a* and a second support rod 3423*b* to support the second hand 3420*b*. Accordingly, the support rod 3423 stably supports the hand 3420 during the operating of the hand 3420 to minimize the hand 3420 shaken. The guide rail 1100 will be described before the description of the shape of each support rod 3423.

The guide rail 1100 guides a direction in which the support rod 3423 is moved. For example, support rods 3423 may move linearly in the horizontal direction. The guide rail 1100 includes a first guide rail 1120, on which the first support 3423*a* is mounted, and a second guide rail 1140 on which the second support rod 3423*b* is mounted. The first support rod 3423*a* is connected to the first guide rail 1120, and the second support rod 3423*b* is connected to the second guide rail 1140. The first guide rail 1120 and the second guide rail 1140 have longitudinal directions parallel to each other. The first guide rail 1120 and the second guide rail 1140 have longitudinal directions extending in the horizontal directions. Support rods 3423 mounted on the guide rail 1100 are movable in the first direction which is the longitudinal direction of each guide rail 1100. First guide rails 1120 are mounted on one side surface and another side surface of the support structure 1000. In this case, the one side surface and the another side surface may be opposite side surfaces to each other. When viewed from a side portion, the first guide rails 1120 may be positioned to be overlapped with each other. A plurality of second guide rails 1140 may be mounted on the top surface of the support structure 1000. When viewed from above, the second guide rails 1140 may be arranged in the direction in which the one side surface and the another side surface of the support structure 1000 face each other.

The first support rod 3423*a* is provided in the shape to surround the second hand 3420*b* and the second support rod 3423*b* when viewed from the front. When viewed from above, the first support rod 3423*a* extends towards opposite sides surfaces of the support structure 1000 from the rear end of the first hand 3420*a* and then extends downward to be connected to the first guide rail 1120.

In addition, the second support rod 3423*b* branches while extending downward from the rear end of the second hand 3420*b* and is connected to the second guide rail 1140. When viewed from above, second support rods 3423*b* are positioned to be overlapped with the second guide rail 1140.

According to the present embodiment, the position of the guide rail 1100 and the shape of the support rod 3423 improve space efficiency. In other words, when the first guide rail 1120 and the second guide rail 1140 are mounted only on the top surface of the support structure 1000, the top surface of the support structure 1000 is required to have a wider area. When the first guide rail 1120 and the second guide rail 1140 are mounted only on a side surface of the support structure 1000, the side surface of the support structure is required to have a wider area.

In addition, the present embodiment has been described that one first support rod 3423a and one second support rod 3423b are provided. However, a plurality of first support rods 3423a and a plurality of second support rods 3423b may be provided. According to an embodiment, two first support rods 3423a and two second support rods 3423b may be provided.

The support structure 1000 is supported and rotated by the rotating shaft 3425. The rotating shaft 3425 is mounted on the base 3426 and provided to be rotatable about the central axis on the base 3426. As the rotating shaft 3425 is rotated, the support structure 1000 and the hand 3420 may be rotated together by the rotating shaft 3425. The base 3426 may be provided to be movable upward and downward. As the base 3426 moves upward and downward, the rotating shaft 3425 and the hand 3420 may be moved upward and downward together. In addition, the base 3426 is movable from a position adjacent to a front buffer 3802 to a position adjacent to a rear buffer 3804 along the transfer rail 3300. The transfer rail 3300 is provided to have a longitudinal direction that faces the first direction. The base 3426 mounted on the transfer rail 3300 may be moveable in the first direction by a driving member (not illustrated).

Figure 7:
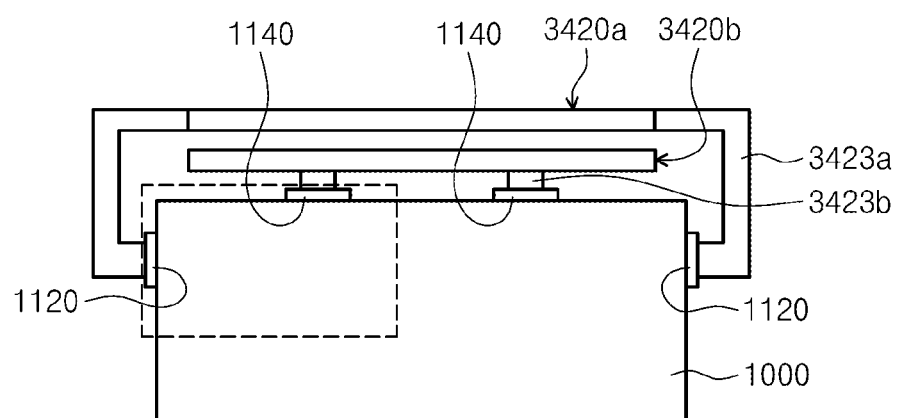
FIG. 7 is a front view illustrating a transfer robot of FIG. 5.
Figure 8:
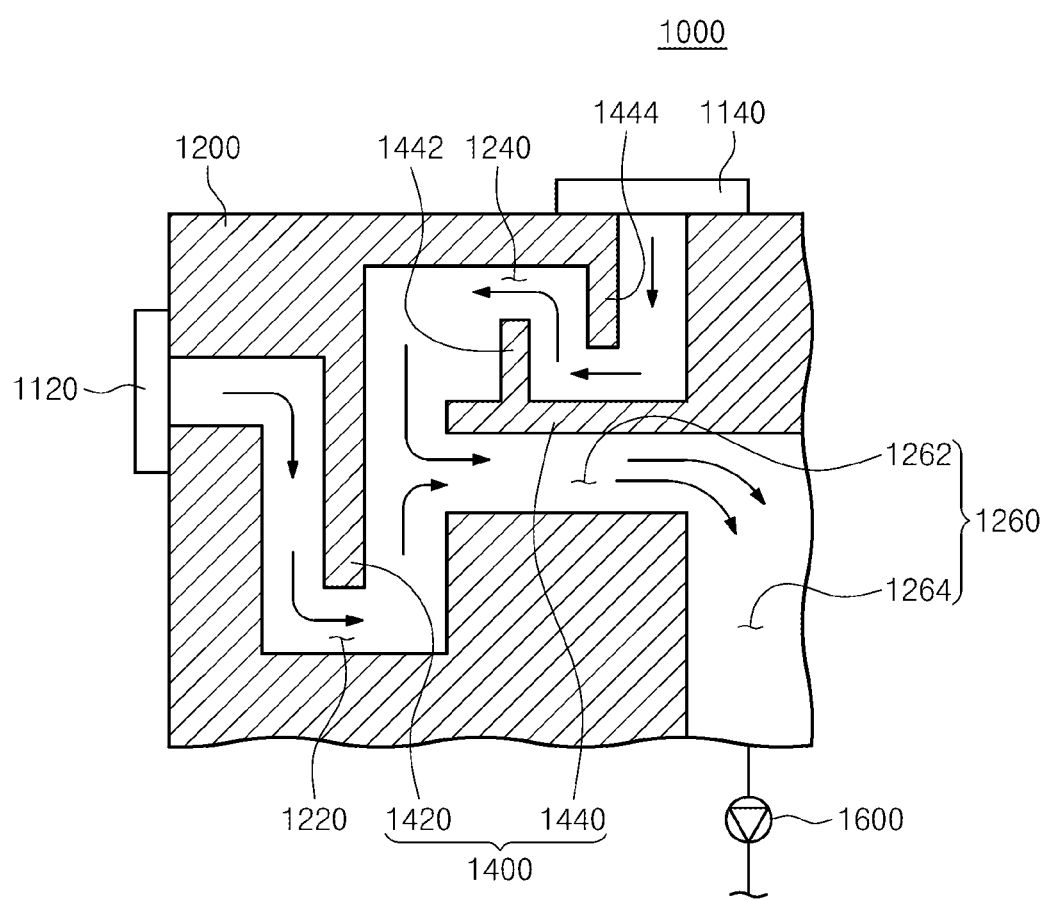
FIG. 8 is a vertical sectional view illustrating an air flow in an exhaust fluid passage of FIG. 7.

Hereinafter, the support structure 1000 will be described in more detail. FIG. 7 is a front view illustrating the transfer robot of FIG. 5, and FIG. 8 is a sectional view illustrating an air flow in an exhaust fluid passage of FIG. 7. Referring to FIGS. 7 and 8, the support structure 1000 includes a main body 1200 having the exhaust fluid passage formed therein and a partition 1400. The first guide rails 1120 are mounted on the opposite side surfaces of the main body 1200 and the second guide rail 1140 is mounted on the top surface of the main body 1200. The exhaust fluid passage is provided to be connected to the first guide rail 1120 and the second guide rail 1140, and the pressure of the exhaust fluid passage is reduced by the pressure reducing member 1600. The exhaust fluid passage is provided to prevent particles produced due to the movement of the support rod 3423 on the guide rail 1100, and the pressure of the exhaust pressure is reduced. Accordingly, the particles produced due to the movement of the support rod 3423 are discharged through the exhaust fluid passage. The exhaust fluid passage includes a first fluid passage 1220, a second fluid passage 1240, and a third fluid passage 1260.

The first fluid passage 1220 is provided to communicate with the first guide rail 1120, and the second fluid passage 1240 is provided to communicate with the second guide rail 1140. The third fluid passage 1260 is provided by combining the first fluid passage 1220 and the second fluid passage 1240. The third fluid passage 1260 is positioned more closely to the central axis of the support structure than the first fluid passage 1220 and the second fluid passage 1240. The third fluid passage 1260 may be positioned to be lower than the first fluid passage 1220 and the second fluid passage 1240. This is to prevent particles remaining in the third fluid passage 1260 from flowing back into the first fluid passage 1220 or the second fluid passage 1240. The first fluid passage 1220 and the second fluid passage 1240 have forms bent in a direction of approaching the third fluid passage 1260. This is to prevent particles remaining in the exhaust fluid passage from flowing back. The first fluid passage 1220 extends toward the central axis of the support structure from the first guide rail 1120 and is combined with the third fluid passage 1260. The second fluid passage 1240 extends downward from the second guide rail 1140 and is combined with the third fluid passage 1260. The first fluid passage 1220 and the second fluid passage 1240 have the bent forms through partitions 1400.

The partitions 1400 are positioned at the first fluid passage 1220 and the second fluid passage 1240. The partition 1400 interferes with the air flow such that the air flow lines in the fluid passage are bypassed. The partition 1400 provided at the first fluid passage 1220 is referred to as a first partition 1420, and the partition provided at the second fluid passage 1240 is referred to as a second partition 1440.

The first partition 1420 is positioned inward from the first guide rail 1120 while facing the first guide rail 1120. For example, the first partition 1420 is provided to extend downward from a ceiling surface forming the first fluid passage 1220. The first partition 1420 is spaced apart from a bottom surface forming the first fluid passage 1220. Accordingly, the air flow and the particles introduced through the first guide rail 1120 may be moved in a direction of a bent inner part.

The second partition 1440 is positioned under the second guide rail 1140 while facing the second guide rail 1140. The second partition 1440 is guided to be moved into the third fluid passage 1260 positioned at the central axis after moving an air flow introduced through the second guide rail 1140 away from the central axis of the support structure. Accordingly, the air flow and the particles introduced through the first guide rail 1140 may be moved in a direction of a lower portion which is bent. For example, a plurality of protrusions 1442 and 1444 are provided to protrude between the ceiling surface and the bottom surface forming the second fluid passage 1240, such that air flow, which flows through the second fluid passage 1240, is bent.

The pressure of the third fluid passage 1260 is reduced by the pressure reducing member 1600. The pressure reducing member 1600 may be a pump 1600. The third fluid passage 1260 has a first region 1262 and a second region 1264. The second region 1264 serve as a central fluid passage positioned at the central axis of the support structure, and a plurality of first regions 1262 are provided to serve as branch fluid passages branching from the second region 1264. Some of the branch fluid passages 1262 are formed by combining the first fluid passage 1220 and the second fluid passage 1240 which are positioned at one side of the central axis of the support structure 1000, and other of the branch fluid passages 1262 are formed by combining the first fluid passage 1220 and the second fluid passage 1240 which are positioned at opposite sides of the central axis of the support structure 1000. The branch fluid passages 1262 is positioned higher than a lower end of the first partition 1400. Accordingly, the air flow flowing through the first fluid passage 1220 may be primarily bypassed by the first partition 1400 and may be secondarily bypassed due to the height of the branch fluid passage 1262.

According to an embodiment described above, the hand 3420 is supported by the support rod 3423 connected to the plurality of guide rails 1100. Accordingly, the hand 3420 may be more stably supported as compared with the case that the hand 3420 is supported by the support rod 3423 connected to a single guide rail 1100. Accordingly, the shaking of the hand 3420 may be minimized in the procedure that the hand 3420 is driven.

In addition, the fluid passage communicating with the guide rail 1100 has a bent shape. Accordingly, it is difficult for particles, which are introduced into the exhaust fluid passage, from flowing back.

In addition, the fluid passages connected to the guide rails 1100 are combined with the third fluid passage 1260, and reduced in pressure by the pressure reducing member 1600. Therefore, a plurality of pressure reducing members 1600 are not necessary to exhaust gas from the fluid passages.

A plurality of heat treating chambers 3202 are provided. The heat treating chambers 3202 are arranged in the first direction 12. The heat treating chambers 3202 are positioned at one side of the transfer chamber 3400.

Figure 9:
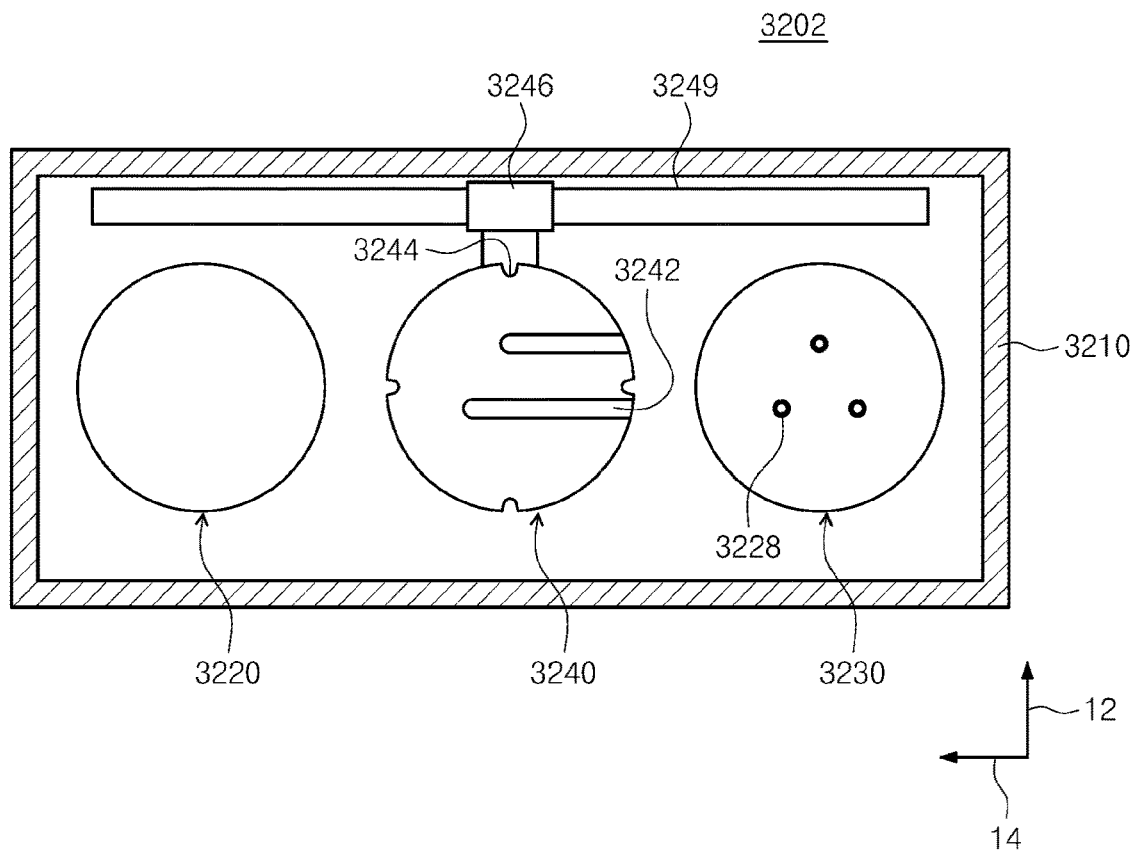
FIG. 9 is a plan view schematically illustrating a heat treating chamber of FIG. 4.
Figure 10:
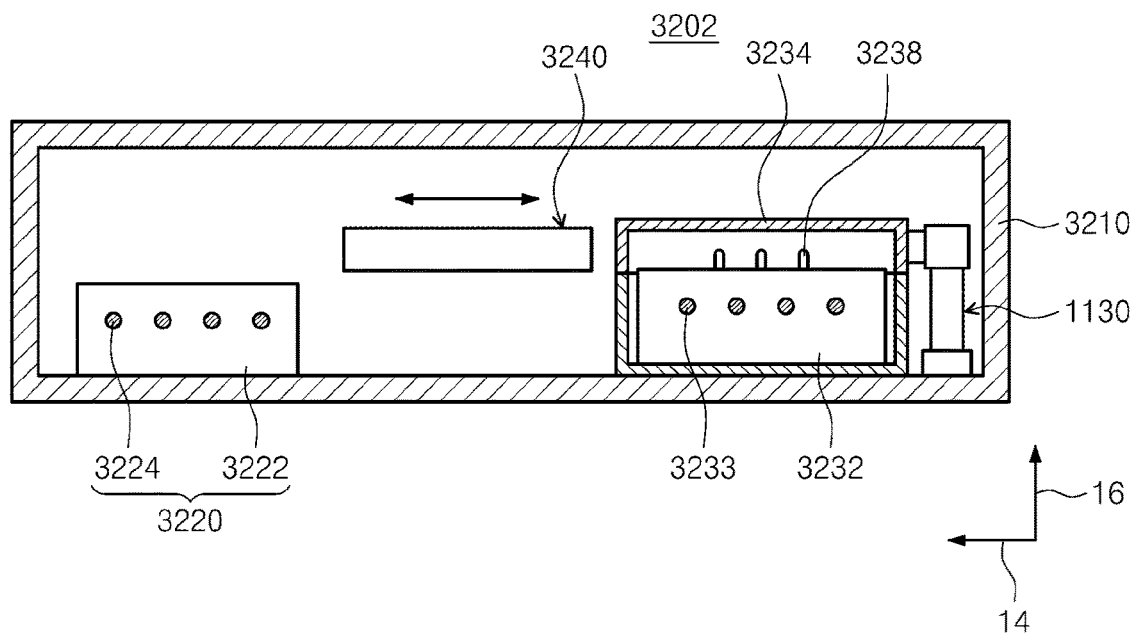
FIG. 10 is a front view illustrating the heat treating chamber of FIG. 9.

FIG. 9 is a plan view schematically illustrating a heat treating chamber of FIG. 4, and FIG. 10 is a front view illustrating the heat treating chamber of FIG. 9. Referring to FIGS. 9 and 10, the heat treating chamber 3202 has a housing 3210, a cooling unit 3220, a heating unit 3230, and a transfer plate 3240.

The housing 3210 substantially has a rectangular parallelepiped shape. The housing 3210 is formed in a sidewall thereof with an entrance (not illustrated) to introduce or withdraw the substrate 'W'. The entrance may be maintained in an open state. A door (not illustrated) may be provided to selectively open or close the entrance. The cooling unit 3220, the heating unit 3230, and the transfer plate 3240 are provided in the housing 3210. The cooling unit 3220 and the heating unit 3230 are provided side by side along the second direction 14. According to an embodiment, the cooling unit 3220 may be positioned more closely to the transfer chamber 3400 rather than the heating unit 3230.

The cooling unit 3220 has a cooling plate 3222. The cooling 3222 may have a circular shape when viewed from above. The cooling plate 3222 has a cooling member 3224. According to an embodiment, the cooling member 3224 may be formed inside the cooling plate 3222 to serve as a fluid passage through which a cooling fluid flows.

The heating unit 3230 has a heating radiation 3232, a cover 3234, and a heater 3233. The heating plate 3232 may have a substantially circular shape when viewed from above. The heating plate 3232 may has a diameter larger than that of the substrate 'W'. The heater 3233 is placed in the heating plate 3232. The heater 3233 may be provided in the form of a heating resistor to which a current is applied. Lift pints 3238 are provided on the heating plate 3232 to be driven in the vertical direction along the third direction 16. The lift pin 3238 receives the substrate 'W' from the conveying unit outside the heating unit 3230 to place the substrate 'W' on the heating plate 3232 or lifts the substrate 'W' from the heating plate 3232 to transmit the substrate 'W' to the transfer unit outside the heating unit 3230. According to an embodiment, three lift pins 3238 may be provided. The cover 3234 has an inner space having an open top surface. The cover 3234 is positioned above the heating plate 3232. When the cover 3234 makes contact with the heating plate 3232, a space surrounded by the cover 3234 and the heating plate 3232 is provided as a heating space to heat the substrate 'W'.

The transfer plate 3240 is provided in the shape of a substantially circular plate, and has a diameter corresponding to that of the substrate 'W'. A notch 3244 is formed in one sidewall of the transfer plate 3240. The notch 3244 may have the shape corresponding to a supporting protrusion 3421*b* formed on the hands 3420 of the transfer robots 3422 and 3424. In addition, notches 3244 may be provided in number corresponding to the number of supporting protrusions 3421*b* formed on the hand 3420 and may be formed at positions corresponding to the supporting protrusions 3421*b*. When the vertical positions of the hand 3420 and the transfer plate 3240 are changed in the state that the hand 3420 and the transfer plate 3240 are aligned in the vertical direction, the substrate 'W' is transferred between the hand 3420 and the transfer plate 3240. The transfer plate 3240 may be mounted on the guide rail 3249, and may move between the first area 3212 and the second area 3214 along the guide rail 3249 by the driver 3246. A plurality of guide grooves 3242 are provided in the shape of a slit in the transfer plate 3240. The guide groove 3242 extends from an end portion of the transfer plate 3240 to an inner part of the transfer plate 3240. The longitudinal direction of the guide groove 3242 is provided in the second direction 14, and the guide grooves 3242 are positioned to be spaced apart from each other in the first direction 12. The guide groove 3242 prevents the interference between the transfer plate 3240 and the lift pin 1340 when the substrate 'W' is transferred between the transfer plate 3240 and the heating unit 3230.

The heating of the substrate 'W' is achieved when the substrate 'W' is directly placed on the support plate 1320, and the cooling of the substrate 'W' is achieved in the state that the transfer plate 3240 having the substrate 'W' makes contact with the cooling plate 3222. The transfer plate 3240 is formed of a material having a heat transfer coefficient such that heat is smoothly transferred between the cooling plate 3222 and the substrate 'W'. According to an embodiment, the transfer plate 3240 may be formed of a metallic material.

Heating units 3230 provided in some of the heat treating chambers 3200 may improve the attachment rate of the photoresist to the substrate 'W' by feeding gas during the heating of the substrate 'W'. According to an example, the gas may include hexamethyldisilane gas.

A plurality of liquid treating chambers 3600 are provided. Some of the liquid treating chambers 3600 may be provided to be stacked on each other. The heat treating chambers 3600 are positioned at one side of the transfer chamber 3402. The liquid treating chambers 3600 are arranged side by side in the first direction 12. Some of the liquid treating chambers 3600 are provided in a position adjacent to the index module 20. Hereinafter, these liquid treating chambers are referred to as front liquid treating chambers. Others of the liquid treating chambers 3600 are provided in a position adjacent to the interface module 40. Hereinafter, these liquid treating chambers are referred to as rear liquid treating chambers 3604.

A first liquid is coated on the substrate 'W' in the front liquid treating chamber 3602, and a second liquid is coated on the substrate 'W' in the rear liquid treating chamber 3604. The first liquid may be different from the second liquid. According to an embodiment, the first liquid is an anti-reflective liquid, and the second liquid is photoresist. The photoresist may be coated on the substrate 'W' having an anti-reflective film. Alternatively, the first liquid may be photoresist and the second liquid may be an anti-reflective liquid. In this case, the anti-reflective liquid may be coated onto the substrate 'W' coated with photoresist. Alternatively, the first liquid and the second liquid may be the same type of liquids, and all the first liquid and the second liquid may be photoresists.

Figure 11:
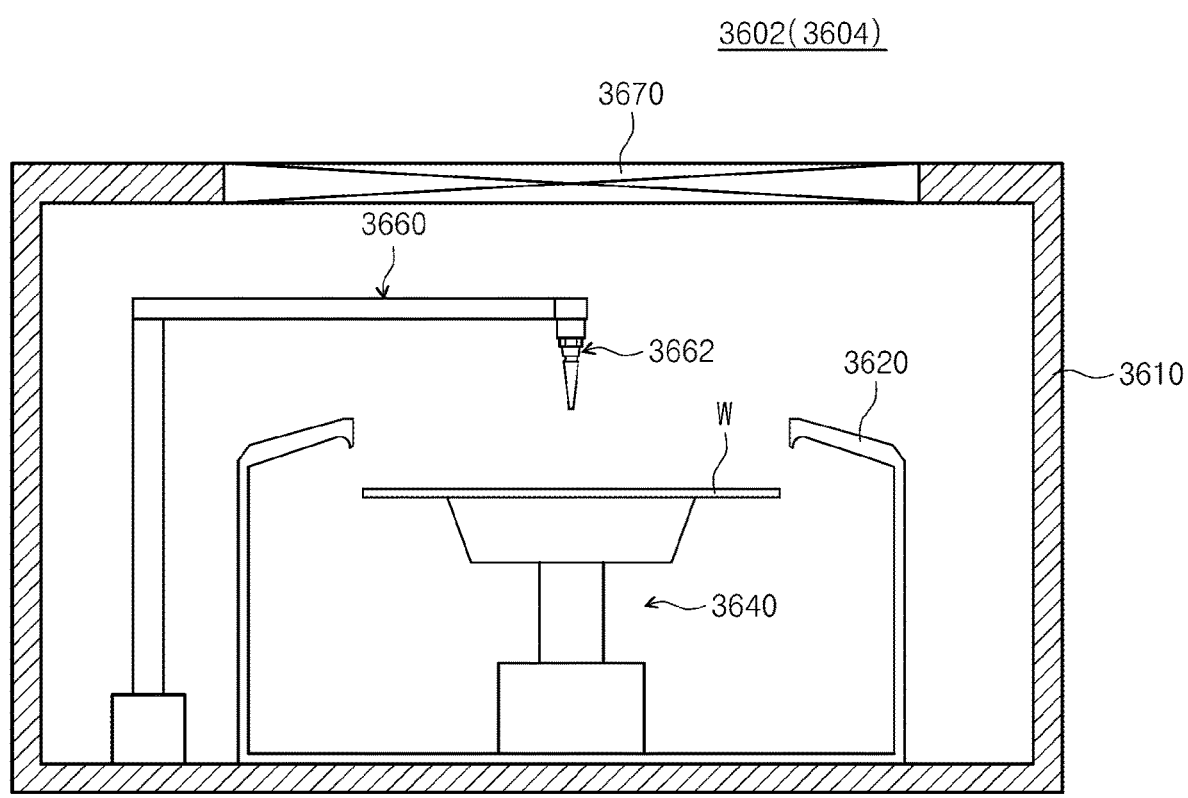
FIG. 11 is a view schematically illustrating a liquid treating chamber of FIG. 4.

FIG. 11 is a view schematically illustrating a liquid treating chamber of FIG. 4. Referring to FIG. 11, the liquid treating chamber 3600 has a housing 3610, a cup 3620, a substrate support unit 3640, and a liquid supply unit 3660. The housing 3610 substantially has a rectangular parallelepiped shape. The housing 3610 is formed in a sidewall thereof with an entrance (not illustrated) to introduce or withdraw the substrate 'W'. The entrance may be open by a door (not illustrated). The cup 3620, the substrate support unit 3640, and the liquid supply unit 3660 are provided in the housing 3610. A fan filter unit 3670 may be provided on a top wall of the housing 3610 to form a descending current inside the housing 3260. The cup 3620 has a treatment space having an open upper portion. The substrate support unit 3640 is provided in the treatment space to support the substrate 'W'. The substrate support unit 3640 is provided such that the substrate 'W' is rotatable during the liquid treatment. The liquid supply unit 3660 supplies liquid to the substrate 'W' supported by the substrate support unit 3640.

The nozzle 3662 supplies liquid on the substrate 'W' at a process position facing the substrate supported by the substrate support unit. For example, the liquid may be a photosensitive liquid such as a photoresist. The process position may be a position in which the nozzle 3662 may discharge the photoresist to the center of the substrate.

Referring back to FIGS. 3 and 4, a plurality of buffer chambers 3800 are provided. Some of buffer chambers 3800 are interposed between the index module 20 and the transfer chamber 3400. Hereinafter, the buffer chamber is referred to as a front buffer. A plurality of front buffers 3802 are provided and stacked on each other in the vertical direction. Others of the buffer chambers 3802 and 3804 are interposed between the transfer chamber 3400 and the interface module 40. The buffer chambers are referred to as a rear buffer 3804. A plurality of front buffers 3804 are provided and stacked on each other in the vertical direction. The front buffers 3802 and the rear buffers 3804 temporarily store a plurality of substrates 'W'. The substrate 'W' stored in the front buffer 3802 is introduced and withdrawn by the index robot 2200 and the transfer robot 3422. The substrate 'W' stored in the rear buffer 3804 is introduced and withdrawn by the transfer robot 3422 and the first robot 4602.

The developing block 30b has the heat treating chamber 3200, the transfer chamber 3400, and the liquid treating chamber 3600. The heat treating chamber 3200, and the transfer chamber 3400 in the developing block 30b have the structures and the arrangement substantially similar to those of the heat treating chamber 3200 and the transfer chamber 3400 in the coating block 30a, so the details thereof will be omitted.

However, all the liquid treating chambers 3600 in the developing block 30b supply the same developing liquid such that the substrate 'W' is subject to the developing treatment.

The interface module 40 connects the treating module 30 with an external exposing device 50. The interface module 40 has an interface frame 4100, an additional process chamber 4200, an interface buffer 4400, and a transfer member 4600.

A fan filter unit may be provided on the upper end of the interface frame 4100 to form a descending air stream in the interface frame 4100. The additional process chamber 4200, the interface buffer 4400, and the transfer member 4600 are provided inside the interface frame 4100. The substrate 'W' subject the process in the coating block 30a may be subject to a predetermined additional process in the additional process chamber 4200 before introduced into the exposing device 50. Alternatively, the substrate 'W' subject the process in the exposing device 50 may be subject to a predetermined additional process in the additional process chamber 4200 before introduced into the developing block 30b. According to an embodiment, the additional process may be an edge exposing process to expose an edge area of the substrate 'W', a top surface cleaning process to clean the top surface of the substrate 'W', or a bottom surface cleaning process to clean the bottom surface of the substrate 'W'. A plurality of additional process chambers 4200 may be provided and may be provided to be stacked on each other. All the additional process chambers 4200 may be provided to perform the same process. Alternatively, some of the additional process chambers 4200 may be provided to perform mutually different processes.

The interface buffer 4400 provides a space to temporarily stay the substrate 'W', which is transferred among the interface buffer 4400, the coating block 30a, the additional process chamber 4200, the exposing device 50, and the developing block 30b. A plurality of interface buffers 4400 are provided and may be provided to be stacked on each other.

According to an embodiment, when viewed based on a line extending in the longitudinal direction of the transfer chamber 3400, the additional process chamber 4200 may be disposed at one side, and the interface buffer 4400 may be disposed at an opposite side.

The transfer member 4600 transfers the substrate 'W' among the coating block 30a, the additional process chamber 4200, the exposing device 50, and the developing block 30b. The transfer member 4600 may be provided with one or a plurality of robots. According to an embodiment, the transfer member 4600 has a first robot 4602 and a second robot 4606. The first robot 4602 may be provided to transfer the substrate 'W' among the coating block 30a, the additional process chamber 4200, and the interface buffer 4400, and the interface robot 4606 may be provided to carry the substrate 'W' between the interface buffer 4400 and the exposing device 50, and the second robot 4604 may be provided to carry the substrate 'W' between the interface buffer 4400 and the developing block 30b.

The first robot 4602 and the second robot 4606 may include hands in which the substrate 'W' is placed, and the hands may be provided to be movable forward and backward, rotatable about an axis parallel to the third direction 16, and movable in the third direction 16.

The hands of the index robot 2200, the first robot 4602, and the second robot 4606 may be all provided in the same shape as the hand 3420 of the transport robot 3342. Alternatively, the hand of the robot to directly transfer and receive the substrate 'W' together with the transfer plate 3240 of the heat treating chamber are provided in the same shapes as those of the hand 3420 of the transfer robot 3422, and the hand of the remaining robot may be provided in the shape different from the shapes.

According to an embodiment, the index robot 2200 may be provided to directly transmit and receive the substrate 'W' together with the heating unit 3230 of the front heat treating chamber 3200 provided in the coating block 30a.

In addition, the transfer robot 3342 provided in the coating block 30a and the developing block 30b may be provided to directly exchange the substrate 'W' with the transfer plate 3240 positioned in the heat treating chamber 3200.

According to an embodiment of the inventive concept, the plurality of fluid passages communicating with the guide rail are combined with each other in the support structure, and the pressure of the fluid passages is reduced by the pressure reducing member. Accordingly, the particles produced in the procedure of operating the hand may be suctioned and removed.

In addition, according to an embodiment of the inventive concept, the fluid passage is provided to be bent. Accordingly, the particles may be prevented from flowing back.

In addition, according to an embodiment of the inventive concept, the hand is supported by the support rod connected to the plurality of guide rails. Accordingly, the hand may be stably supported.

The above description has been made for the illustrative purpose. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. The written embodiment describes the best state for implementing the technical spirit of the inventive concept, and various changes required in the detailed application fields and purposes of the inventive concept can be made. Furthermore, it should be construed that the attached claims include other embodiments.

What is claimed is:

1. A unit for transferring a substrate, the unit comprising:
a support structure;
a first hand to place the substrate;
a second hand positioned to be stacked with the first hand and to place the substrate;
a first guide rail provided in the support structure and configured to guide movement of a first support rod to support the first hand;
a second guide rail provided in the support structure and configured to guide movement of a second support rod to support the second hand; and
a pressure reducing member to reduce pressure of an exhaust fluid passage provided in the support structure,
wherein the exhaust fluid passage includes:
only one first fluid passage provided to communicate with the first guide rail;
only one second fluid passage provided to communicate with the second guide rail; and
a third fluid passage formed by combining the first fluid passage with the second fluid passage, and
wherein the pressure reducing member reduces pressure of the third fluid passage.

2. The unit of claim 1, wherein the first fluid passage and the second fluid passage have parts which are bent.

3. The unit of claim 1, wherein the first guide rail is formed on a side surface of the support structure, and
wherein the second guide rail is formed on a top surface of the support structure.

4. The unit of claim 1, wherein the support structure includes:
a main body including the exhaust fluid passage, the first guide rail, and the second guide rail;
a first partition positioned in the first fluid passage and configured to interfere with an air flow such that an air flow line of the first fluid passage is bypassing in the first partition; and
a second partition positioned in the second fluid passage and configured to interfere with an air flow such that an air flow line of the second fluid passage is bypassing in the second partition, and
wherein the third fluid passage is positioned more closely to a central axis of the main body than the first fluid passage and the second fluid passage.

5. The unit of claim 4, wherein the first partition is positioned inward from the first guide rail to face the first guide rail.

6. The unit of claim 5, wherein the first partition is provided to extend downward from a ceiling surface forming the first fluid passage and is spaced apart from a bottom surface forming the first fluid passage.

7. The unit of claim 4, wherein the second partition is positioned under the second guide rail while facing the second guide rail.

8. The unit of claim 4, wherein the third fluid passage is formed by combining the first fluid passage and the second fluid passage, and has a first region extending toward the central axis and a second region extending downward from the first region, and
wherein the first region is positioned higher than a lower end of the first partition.

9. The unit of claim 1, wherein the pressure reducing member comprises a pump.

10. A unit for transferring a substrate, the unit comprising:
a support structure;
a first hand to place the substrate;
a second hand positioned to be stacked with the first hand and to place the substrate;
a first guide rail provided in the support structure and configured to guide movement of a first support rod to support the first hand; and
a second guide rail provided in the support structure and configured to guide movement of a second support rod to support the second hand;
wherein the first guide rail is formed on a side surface of the support structure,
wherein the second guide rail is formed on a top surface of the support structure,
wherein an exhaust fluid passage is provided in the support structure, and
wherein the exhaust fluid passage includes:
only one first fluid passage provided to communicate with the first guide rail;
only one second fluid passage provided to communicate with the second guide rail;
a third fluid passage formed by combining the first fluid passage with the second fluid passage.

11. The unit of claim 10, wherein a plurality of first guide rails and a plurality of second guide rails are provided,
wherein the plurality of first guide rails are provided on opposite side surfaces of the support structure,
wherein the plurality of second guide rails are formed on a top surface of the support,
wherein the first support rod is connected to the plurality of first guide rails, and
wherein the second support rod is connected to the plurality of second guide rails.

12. The unit of claim 11, wherein the first hand is positioned above the second hand.

13. The unit of claim 12, further comprising:
a pressure reducing member to reduce pressure of the exhaust fluid passage provided in the support structure,
wherein the pressure reducing member reduces pressure of the third fluid passage.

14. An apparatus for treating a substrate, the apparatus comprising:
a first unit;
a second unit; and
a transfer unit to transfer the substrate between the first unit and the second unit, and
wherein the transfer unit includes:
a support structure;
a first hand to place the substrate;

a second hand positioned to be stacked with the first hand and to place the substrate;

a first guide rail provided in the support structure and configured to guide movement of a first support rod to support the first hand;

a second guide rail provided in the support structure and configured to guide movement of a second guide rod to support the second hand; and a pressure reducing member to reduce pressure of an exhaust fluid passage provided in the support structure, wherein the exhaust fluid passage includes:

only one first fluid passage provided to communicate with the first guide rail;

only one second fluid passage provided to communicate with the second guide rail; and a third fluid passage formed by combining the first fluid passage with the second fluid passage, and wherein the pressure reducing member reduces pressure of the third fluid passage.

15. The apparatus of claim 14, wherein each of the first fluid passage and the second fluid passage is bent in a direction of approaching the third fluid passage.

16. The apparatus of claim 15, wherein the first guide rail is formed on a side surface of the support structure, and wherein the second guide rail is formed on a top surface of the support structure.

17. The apparatus of claim 16, wherein the support structure includes:

a main body including the exhaust fluid passage, the first guide rail, and the second guide rail;

a first partition positioned in the first fluid passage and configured to interfere with an air flow such that an air flow line in the first fluid passage is bypassing in the first partition; and a second partition positioned in the second fluid passage and configured to interfere with an air flow such that an air flow line in the second fluid passage is bypassing in the second partition, and wherein the third fluid passage is positioned more closely to a central axis of the main body than the first fluid passage and the second fluid passage.

18. The apparatus of claim 17, wherein the first partition is positioned inward from the first guide rail to face the first guide rail.

19. The apparatus of claim 18, wherein the first partition is provided to extend downward from a ceiling surface forming the first fluid passage and is spaced apart from a bottom surface forming the first fluid passage.

20. The apparatus of claim 18, wherein the second partition is positioned under the second guide rail to face the second guide rail.

* * * * *